United States Patent [19]
Iyechika et al.

[11] Patent Number: 6,104,044
[45] Date of Patent: Aug. 15, 2000

[54] SEMICONDUCTOR COMPOUND ELECTRODE MATERIAL CONTAINING CALCIUM AND A NOBLE METAL

[75] Inventors: Yasushi Iyechika, Tsukuba; Yoshinobu Ono, Ibaraki; Tomoyuki Takada; Katsumi Inui, both of Tsukuba, all of Japan

[73] Assignee: Sumitomo Chemical Company, Limited, Osaka, Japan

[21] Appl. No.: 08/861,820

[22] Filed: May 23, 1997

[30] Foreign Application Priority Data

May 23, 1996 [JP] Japan ................................. 8-128299

[51] Int. Cl.$^7$ .................. H01L 29/205; H01L 27/15; H01S 3/19
[52] U.S. Cl. ................. 257/103; 257/97; 257/96; 257/94; 257/615; 257/461; 257/744; 257/745
[58] Field of Search ................. 257/96, 94, 103, 257/101, 13, 14, 99, 461, 76, 613, 615, 744, 745

[56] References Cited

U.S. PATENT DOCUMENTS

| | | | |
|---|---|---|---|
| 4,941,032 | 7/1990 | Kobayashi et al. | 257/769 |
| 5,006,908 | 4/1991 | Matsuoka et al. | 257/102 |
| 5,578,839 | 11/1996 | Nakamura et al. | 257/201 |
| 5,652,438 | 7/1997 | Sassa et al. | 257/103 |
| 5,656,832 | 8/1997 | Ohba et al. | 257/103 |
| 5,708,301 | 1/1998 | Iyechika et al. | 257/744 |
| 5,751,752 | 5/1998 | Shakuda | 257/96 |

*Primary Examiner*—Alexander Oscar Williams
*Attorney, Agent, or Firm*—Birch, Stewart, Kolasch & Birch, LLP

[57] ABSTRACT

Disclosed is an electrode material for Group III-V compound semiconductor represented by the general formula $In_xGa_yAl_zN$ (provided that $x+y+z=1$, $0 \leq x \leq 1$, $0 \leq y \leq 1$, and $0 \leq z \leq 1$) doped with a p-type impurity which is capable of obtaining good ohmic contact, and an electrode using the same, thereby making it possible to reduce a driving voltage of a device using the compound semiconductor. The electrode material is a metal comprising at least Ca and a noble metal, wherein the total amount of the weight of Ca and the noble metal is not less than 50% by weight and not more than 100% by weight based on the weight of the whole electrode material.

15 Claims, 3 Drawing Sheets

SEMICONDUCTOR COMPOUND ELECTRODE MATERIAL CONTAINING CALCIUM AND A NOBLE METAL

BACKGROUND OF THE INVENTION

1. Field of the Invention

The present invention relates to an electrode material and an electrode of a p-type Group III-V compound semiconductor used for an ultraviolet light- or blue light-emitting diode, a laser diode or the like. More particularly, it relates to an electrode material and an electrode, capable of obtaining an ohmic contact.

2. Description of the Related Art

As a material of light-emitting devices such as ultraviolet light- or blue light-emitting diode, laser diode or the like, a nitride compound semiconductor represented by the general formula $In_xGa_yAl_zN$ (provided that $x+y+z=1$, $0 \leq x \leq 1$, $0 \leq y \leq 1$, and $0 \leq z \leq 1$) has been known. Electrodes having good current injection characteristics for bringing into contact with either p-type or n-type layers are essential for producing the light-emitting device.

As an electrode material for n-type compound semiconductor, Al and a Ti—Al alloy have hitherto been known as a good electrode material.

As an electrode material for p-type Group III-V compound semiconductor, Au, a Ni—Au alloy, a Mg—Au alloy and a Zn—Au alloy have been known. However, a contact resistance is larger than that of the electrode material for n-type Group III-V compound semiconductor, which leads to a factor of increasing a driving voltage of a light-emitting device. Particularly, in a semiconductor laser into which a large current is injected, there was a problem that the driving voltage becomes very larger because of a large contact resistance.

SUMMARY OF THE INVENTION

An object of the present invention is to provide an electrode material for a Group II I-V compound semiconductor doped with a p-type impurity, capable of obtaining a good ohmic contact, and an electrode using the same, thereby making it possible to reduce a driving voltage of a device using the compound semiconductor.

The present inventors have intensively studied the above matters in the light of these problems. As a result, it has been found that a laminated structure or an alloy of a specific metal exhibits good current injection characteristics to the p-type Group III-V compound semiconductor. Thus, the present invention has been accomplished.

That is, the present invention relates to [1] an electrode material for Group III-V compound semiconductor represented by the general formula $In_xGa_yAl_zN$ (provided that $x+y+z=1$, $0 \leq x \leq 1$, $0 \leq y \leq 1$, and $0 \leq z \leq 1$) doped with a p-type impurity, said electrode material being a metal comprising at least Ca and a noble metal, wherein the total amount of the weight of Ca and the noble metal is not less than 50% by weight and not more than 100% by weight based on the weight of the whole electrode material.

The present invention also relates to [2] an electrode for Group III-V compound semiconductor represented by the general formula $In_xGa_yAl_zN$ (provided that $x+y+z=1$, $0 \leq x \leq 1$, $0 \leq y \leq 1$, and $0 \leq z \leq 1$) doped with a p-type impurity, said electrode being formed on said compound semiconductor using the electrode material of [1].

Figure 1:
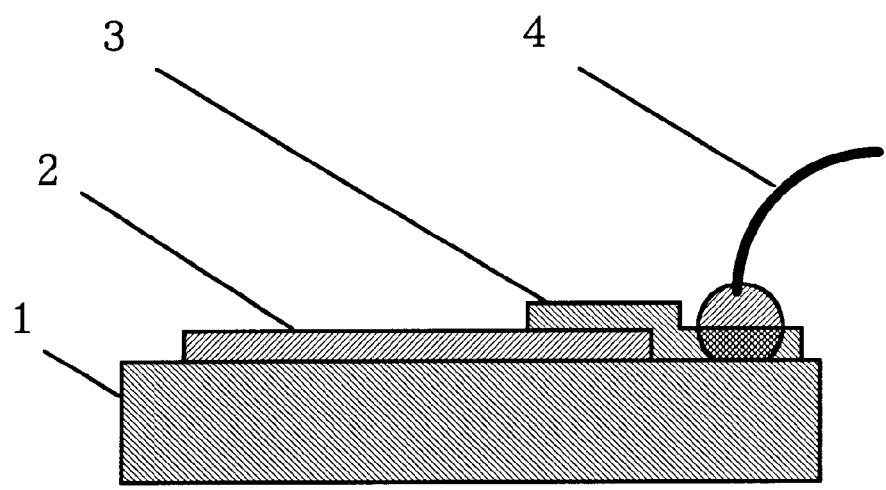
FIG. 1 is a schematic cross section illustrating the embodiment of the electrode wherein other electrodes are laminated on the electrode of the present invention.

1: p-type Group III-V compound semiconductor
2: First electrode of electrode material of the present invention
3: Second electrode
4: Electrode terminal
5: Electrode non-deposited part

DETAILED DESCRIPTION OF THE INVENTION

The present invention will be described in detail, hereinafter.

The Group III-V compound semiconductor in the present invention is a Group III-V compound semiconductor represented by the general formula $In_xGa_yAl_zN$ (provided that $x+y+z=1$, $0 \leq x \leq 1$, $0 \leq y \leq 1$, and $0 \leq z \leq 1$).

Examples of a p-type dopant of the compound semiconductor in the present invention include Mg, Zn, Cd, Be, Ca and Hg. Among them, Ca and Zn are preferred.

The electrode material for p-type compound semiconductor of the present invention comprises at least Ca and a noble metal. Ca is an electrode material which is effective to improve current injection characteristics. When using Ca alone as the electrode, the electrode is liable to be oxidized and the reliability of the electrode is sometimes lowered. However, the oxidization can be prevented by laminating with the noble metal or alloying with the noble metal, thereby enhancing the reliability of the electrode.

In the electrode material of the present invention, examples of the metal comprising at least Ca and a noble metal include a metal of a laminated structure comprising at least a layer of Ca and a layer of a noble metal, and an alloy comprising at least Ca and a noble metal.

Examples of the noble metal include Au, Pt, Ag, Ru, Rh, Pd, Os and Ir. Among them, Au and Pt are preferred, and Au is more preferred.

In case of the electrode material of a laminated structure comprising at least layers of Ca and a noble metal in the present invention, it is preferred that Ca is in contact with the p-type Group III-V compound semiconductor, directly. when Ca is not in contact with the p-type compound semiconductor, directly, the effect of the present invention is not obtained, therefore, it is not preferred.

As a method of producing the electrode material of an alloy comprising at least Ca and a noble metal in the present invention, there is a method of heat-treating a laminated structure comprising at least layers of Ca and a noble metal in an inert gas atmosphere or a method of vacuum-deposition of Ca and a noble metal, simultaneously.

A preferable Ca concentration of the electrode material comprising at least Ca and a noble metal of the present invention is not less than 0.01% by weight and not more than 30% by weight, based on the total weight of Ca and the noble metal. When the Ca concentration is out of the above range, the effect of the present invention is not obtained. Therefore, it is not preferred.

In the electrode material comprising at least Ca and a noble metal of the present invention, the effect of the present invention can be further enhanced by adding a specific third metallic material, in addition to Ca and the noble metal, sometimes. Examples of the third metallic material include Mg, Zn, Ni and the like.

A weight ratio of the third electrode material to the whole electrode material is preferably not less than 0% by weight and less than 50% by weight. When the weight ratio is not less than 50% by weight, the reliability of the electrode is lowered. Therefore, it is not preferred.

It is possible to improve current injection characteristics by forming the electrode material of the present invention on the p-type Group III-V compound semiconductor, followed by an annealing treatment.

As an atmosphere for annealing, there can be used an inert gas such as sufficiently purified nitrogen or argon. The annealing temperature is preferably not less than 200° C. and not more than 1100° C., more preferably not less than 300° C. and not more than 1000° C. When the annealing temperature is too low, sufficient current injection characteristics are not obtained. On the other hand, when the annealing temperature is too high, denaturalization of the material constituting the device or electrode material occurs to cause deterioration of characteristics, sometimes. Therefore, it is not preferred.

The preferable annealing time varies depending on the annealing temperature, but is not less than 1 second and not more than 2 hours, more preferably not less than 2 seconds and not more than 30 minutes. When the annealing time is too short, the sufficient effect in not be obtained. On the other hand, when it is too long, denaturalization of the device constituting material occurs to cause deterioration of device characteristics and decrease in productivity. Therefore, it is not preferred.

The preferable range of a film thickness of the electrode of the present invention is not less than 50 angstroms and not more than 50 $\mu$m. When the film thickness is smaller than 50 angstroms, a sufficient conductivity is not exhibited, sometimes Therefore, it is not preferred. On the other hand, when it is larger than 50 $\mu$m, it requires a longer time to form. Therefore, it is not preferred.

In the electrode used for the light-emitting device such as LED, etc., light emitted from the device can be penetrated though the electrode to take out to the exterior by imparting light transmission properties to the electrode. Therefore, the efficiency of the light-emitting device can be enhanced. In order to impart the light transmission properties to the electrode, it is required to make the film thickness of the electrode thinner. The preferable film thickness in case of imparting the light transmission properties to the electrode material of the present invention is not less than 50 angstroms and not more than 2000 angstroms. When the thickness of the electrode is smaller than 50 angstroms, a sufficient conductivity is not exhibited, sometimes. Therefore, it is not preferred. On the other hand, when it is larger than 2000 angstroms, sufficient light transmission properties are not obtained. Therefore, it is not preferred. The light transmission properties are further improved, sometimes, by annealing a light-transmitting electrode in an inert atmosphere.

It is possible to increase characteristics such as mechanical strength, etc. by further laminating the other metal on the electrode of the present invention in contact with the compound semiconductor within the range where the object of the present invention is not damaged. Specific examples include those wherein the second electrode 3 is in contact with the surface of the first electrode 2 formed of the electrode material of the present invention on the compound semiconductor 1 and the surface of the compound semiconductor. Examples of the metal used for the second electrode include Al, Ti or Cr. Among them, Al is particularly preferred because of excellent adhesion properties. It is preferred to join an electrode terminal to the metal of the second electrode.

EXAMPLES

The following Examples further illustrate the present invention in detail but are not to be construed to limit the scope thereof.

Example 1

GaN doped with Mg by a normal-pressure MOCVD method was grown on a sapphire surface substrate. After growing, a sample was subjected to an annealing treatment in nitrogen at 800° C. for 20 minutes. GaN doped with Mg thus obtained showed a p-type conductivity and an acceptor concentration was about $1 \times 10^{19}$ cm$^{-3}$.

Figure 2:
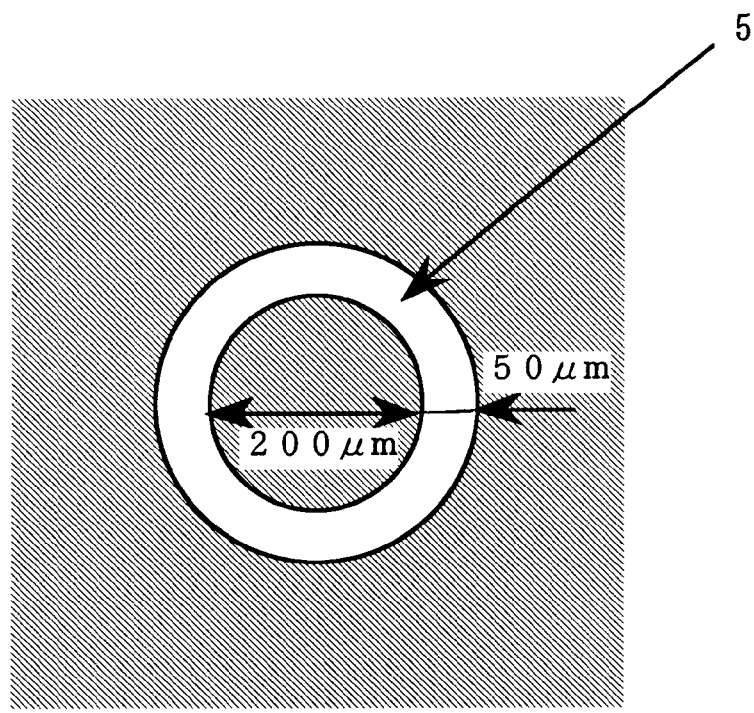
FIG. 2 is a schematic diagram illustrating the electrode pattern produced in Example 1.

Then, Ca and Au were vacuum-deposited in this order on the resulting p-type GaN film according to a pattern shown in FIG. 2 to obtain an electrode. The thickness of Ca and Au was adjusted so that the total thickness becomes 1500 angstroms and the weight of Ca becomes 0.3% by weight of the total weight. Regarding the electrode thus produced, it is a forward direction in case that a circular electrode on the inside of the pattern of FIG. 2 becomes positive.

Figure 3:
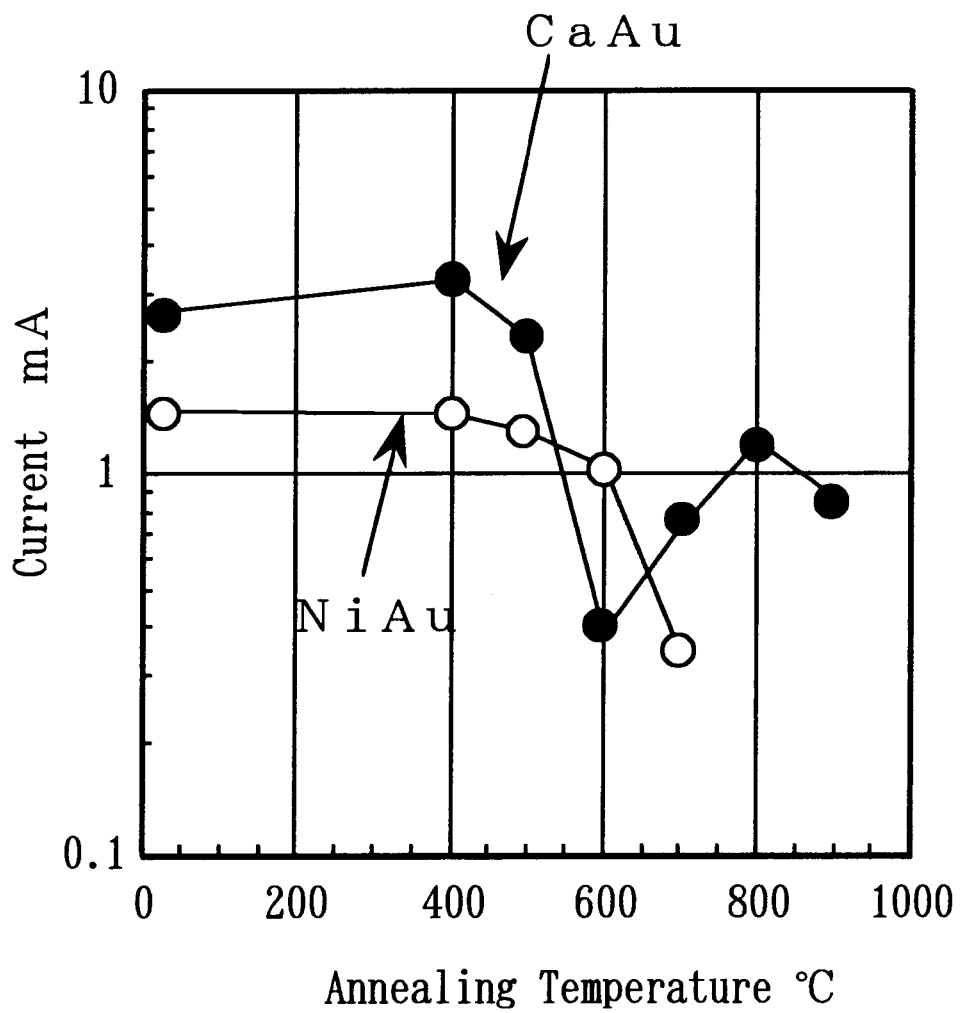
FIG. 3 is a graph illustrating a relation between the annealing temperature and the current of the electrodes of Example 1 and Comparative Example 1.

A relation between the annealing temperature of the electrode of the present invention and the current, which flows when applying 4 V in the forward direction, is shown in FIG. 3. Annealing was conducted in nitrogen for 90 seconds. It was found that this Example shows good current injection characteristics when the annealing temperature is not more than 500° C., or not less than 700° C. and not more than 900° C.

Comparative Example 1

According to the same manner as that described in Examples 1 except for laminating Ni and Au in order as a conventional electrode material in place of laminating Ca and Au, an electrode was produced. The thickness of Ca and Au was adjusted so that the total thickness becomes 1500 angstroms and the weight of Ni becomes 1% by weight of the total weight.

A relation between the annealing temperature of the electrode of this Comparative Example and the current, which flows when applying 4 V in the forward direction, is shown in FIG. 3. Annealing was conducted in nitrogen for 90 seconds. Current injection characteristics did not change largely when the annealing temperature was less than 500° C. When it was not less than 600° C., the current became lowered. The current was lower than that of Example 1, except that at 600° C.

The electrode obtained by using the electrode material of the present invention shows a small contact resistance to a p-type nitride Group III-V compound semiconductor. Therefore, when using the electrode which is superior in current injection characteristics, there can be produced a light-emitting device such as LED, laser diode, etc. and is capable of driving at low voltage. Accordingly, the present invention is significant and an industrial value thereof is great.

What is claimed is:

1. An electrode material for a Group III-V compound semiconductor represented by the general formula $In_xGa_yAl_zN$, provided that x+y+z=1, $0 \leq x \leq 1$, $0 \leq y \leq 1$, and $0 \leq z \leq 1$, doped with a p-type impurity, said electrode material being a metal comprising at least Ca and a noble metal, wherein the total amount of the weight of Ca and the noble metal is not less than 50% by weight and not more than 100% by weight based on the weight of the whole electrode material.

2. An electrode for a Group III-V compound semiconductor represented by the general formula $In_xGa_yAl_zN$ (provided that x+y+z=1, $0 \leq x \leq 1$, $0 \leq y \leq 1$, and $0 \leq z \leq 1$, doped with a p-type impurity, said electrode being formed on said compound semiconductor using the electrode material of claim 1.

3. The electrode material of claim 1, wherein the p-type impurity is selected from the group consisting of Mg, Zn, Cd, Be, Ca and Hg.

4. The electrode of claim 2, wherein the p-type impurity is selected from the group consisting of Mg, Zn, Cd, Be, Ca and Hg.

5. The electrode material of claim 1, wherein the p-type impurity is selected from the group consisting of Ca and Zn.

6. The electrode of claim 2, wherein the p-type impurity is selected from the group consisting of Ca and Zn.

7. The electrode material of claim 1, wherein the noble metal is selected from the group consisting of Au, Pt, Ag, Ru, Rh, Pd, Os and Ir.

8. The electrode of claim 2, wherein the noble metal is selected from the group consisting of Au, Pt, Ag, Ru, Rh, Pd, Os and Ir.

9. The electrode material of claim 1, wherein the noble metal is selected from the group consisting of Au and Pt.

10. The electrode of claim 2, wherein the noble metal is selected from the group consisting of Au and Pt.

11. The electrode material of claim 1, wherein the p-type impurity is selected from the group consisting of Mg, Zn, Cd, Be, Ca and Hg, and wherein the noble metal is selected from the group consisting of Au, Pt, Ag, Ru, Rh, Pd, Os and Ir.

12. The electrode of claim 2, wherein the p-type impurity is selected from the group consisting of Mg, Zn, Cd, Be, Ca and Hg, and wherein the noble metal is selected from the group consisting of Au, Pt, Ag, Ru, Rh, Pd, Os and Ir.

13. The electrode material of claim 1, further comprising a third metal selected from the group consisting of Mg, Zn and Ni.

14. The electrode of claim 2, wherein the electrode material further comprises a third metal selected from the group consisting of Mg, Zn and Ni.

15. The electrode of claim 2, wherein said electrode has a film thickness of not less than 50 angstroms and not more than 50 microns.

* * * * *